Dec. 29, 1959 N. J. REGNIER ET AL 2,919,298

LIGHT SENSITIVE VOLTAGE PRODUCING DEVICE OR THE LIKE

Filed Oct. 23, 1956 3 Sheets-Sheet 1

NORMAN J. REGNIER
MARLIN R. SHAFFER

*INVENTOR.*

BY [signature]

THEIR ATTORNEY

Dec. 29, 1959 N. J. REGNIER ET AL 2,919,298

LIGHT SENSITIVE VOLTAGE PRODUCING DEVICE OR THE LIKE

Filed Oct. 23, 1956 3 Sheets-Sheet 2

NORMAN J. REGNIER
MARLIN R. SHAFFER
INVENTOR.

BY [signature]

THEIR ATTORNEY

LIGHT SENSITIVE VOLTAGE PRODUCING DEVICE OR THE LIKE

Filed Oct. 23, 1956

3 Sheets-Sheet 3

NORMAN J. REGNIER
MARLIN R. SHAFFER
INVENTOR.
BY
THEIR ATTORNEY

United States Patent Office 2,919,298
Patented Dec. 29, 1959

2,919,298

LIGHT SENSITIVE VOLTAGE PRODUCING DEVICE OR THE LIKE

Norman J. Regnier, Los Angeles, and Marlin R. Shaffer, North Hollywood, Calif., assignors to Hoffman Electronics Corporation, a corporation of California Application October 23, 1956, Serial No. 617,805

5 Claims. (Cl. 136—89)

This invention is related to photovoltaic semiconductor devices responsive to light emanations for producing a utilizable potential difference or voltage, and more particularly to a new and improved, light sensitive, voltage producing device which will require employment of a minimum number of photovoltaic semiconductor devices, or solar cells as they are commonly known.

In the past, many types of light sensitive, voltage producing devices have been designed and have been utilized for converting light energy into electrical energy. Many devices currently in use utilize photovoltaic semiconductor devices characterized by a P–N junction. Such photovoltaic semiconductor devices shall be referred to hereinafter as "solar cells." It is well known that solar cells currently extant are capable of producing from four-tenths to six-tenths of a volt (open circuit) upon normal impingement thereupon of the sun's rays at noonday, and further, that the voltage produced suffers reduction when the light intensity falls off, as in the late afternoon hours or on overcast days. It is known additionally that the same four-tenths to six-tenths of a volt will be generated by light intensities greater than the threshold light intensities required to produce the same voltage, and further, that increased light intensities will have no harmful effect upon the solar cells. Thus, it would be highly desirable that the intensity of the light impinging upon the solar cells be at least at the threshold value (for producing the four-tenths to six-tenths of a volt) during all or substantially all of the daylight hours, whether the day be bright or relatively overcast. If such were the case, then increased intensities during the noonday hours of bright days would still not have any deleterious effects upon the solar cells. Advantages of such a system are readily apparent. In the first place, the output voltage of the device would be substantially constant over all daylight hours and for substantially all weather conditions. In the second place, the number of solar cells required for use would be reduced to a minimum.

Therefore, it is an object of the present invention to provide a new useful light sensitive, voltage producing device.

It is a further object of the present invention to provide a new and useful light sensitive voltage producing device which will require the incorporation of a minimum number of solar cells.

It is a still further object of the present invention to provide a new and useful light sensitive voltage producing device which will exhibit a relatively constant output voltage for substantially all daylight intensity levels of light emanations impinging upon the solar cells employed.

According to the present invention, a light sensitive voltage producing device incorporates one or a plurality of solar cells faced normally downward and, in cooperative relationship therewith, one or a plurality of cup-shaped reflectors for directing reflected light for concentration upon the solar cell sensitive surface or surfaces. The cup-shaped reflectors are preferably segments of paraboloids of revolution with the light sensitive surfaces of the solar cells associated therewith being substantially at, or somewhat above or below, the vertex or focal point of the paraboloid cross-section.

The features of the present invention which are believed to be novel are set forth with particularity in the appended claims. The present invention, both as to its organization and manner of operation, together with further objects and advantages thereof, may best be understood by reference to the following description, taken in connection with the accompanying drawings, in which:

Figure 1:
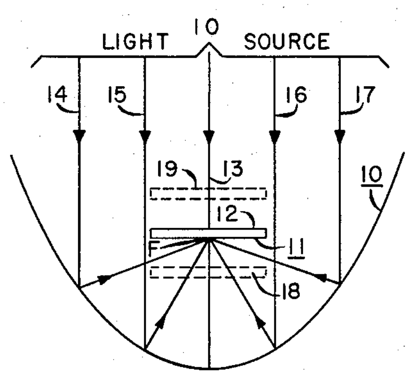
Figure 1 is a schematic representation of the basic conceepts of the present invention.

Consider in Figure 1 the cup-shaped reflective surface 10 and that such reflective surface 10 constitutes, for example, a section of a paraboloid of revolution. Now consider that a photovoltaic semiconductor device, or solar cell, is positioned within the volume defined by reflective surface 10 such that focal point F of the reflective surface falls on the light sensitive surface 11, and in center, of the solar cell 12. As is seen, solar cell 12 is oriented generally in normal disposition with respect to the axis 13 of reflective surface 10. Light rays from light source 10, i.e. rays 14, 15, and 16 and 17, will be reflected from reflective surface 10 to impinge upon light sensitive surface 11 of solar cell 12 in the region of the focal point F of reflective surface. Thus the light intensity in the neighborhood of focal point F will be a maximum and will produce the maximum number of hole-electron pairs in the region of the P–N junction of the solar cells. Assuming for a moment that the curvature of reflective surface 10 is large enough, it may well be preferable to orient solar cell 12 as indicated by either dotted configuration 18 or dotted configuration 19. Thus, if the solar cell is disposed in position 18 (slightly below the position of focal point F) or at position 19 (slightly above focal point F) there should exist a relatively even distribution of light upon the entire light sensitive surface 11 of solar cell 12 so that the entire P–N junction area will be insolated. At all events, provided the light reflective surface 10 is large enough, the cone-shaped light concentration on the light sensitive surface 11 of solar cell 12 will be sufficient, conceivably, to achieve maximum hole-electron pair production throughout the entire P–N junction plane of the solar cell for substantially all daylight hours, be the day sunny or overcast. Hence, what is achieved is a device capable of uniform electrical energy generation throughout the gamut of daytime light intensities, and this with the utilization of a minimum number of solar cells.

Figure 2:
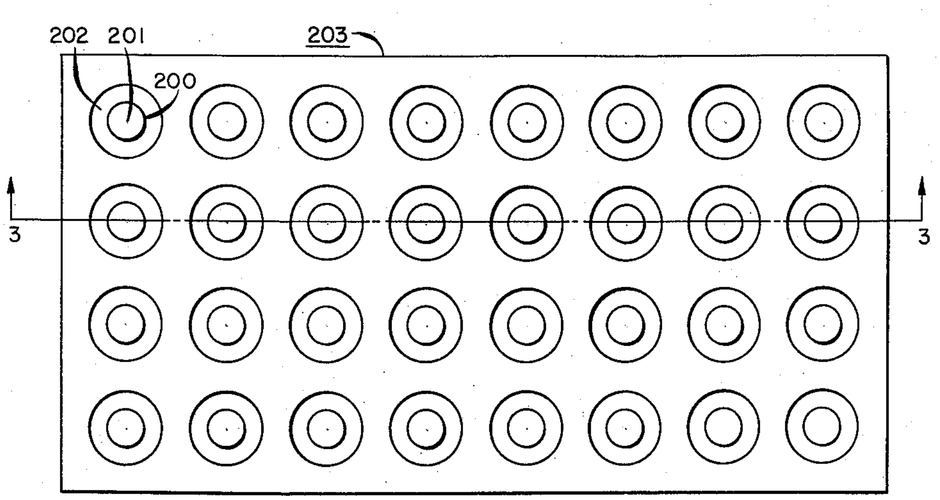
Figure 2 is a schematic representation of a top plan view of multi-solar-cell apparatus incorporating the concepts illustrated in Figure 1.

Figure 2 is a schematic representation, in plan view, of a plurality of banks of solar cell reflector combinations by which a relatively large cross-section of the sun's rays, for example, is utilized for the production of electrical energy of uniform characteristics. Each of the solar cells 200 is disposed upon and normal to axis 201 of the several paraboloid of revolution reflective segments 202. Assume for the moment that appropriate mounting means of minimum light attenuation are provided the several solar cells. It is seen that the concave, paraboloidal, reflective surfaces 202 may constitute regular depressions in a die-formed, unitary, metallic sheet 203.

Figure 3:
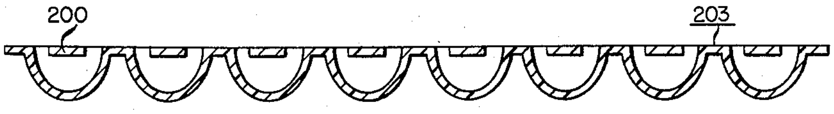
Figure 3 is a cross-sectional view taken along the line 3—3 in Figure 2.

Figure 3 is a cross-sectional view taken along the line 3—3 in Figure 2 showing the cross-section of die-formed sheet 203 and the inter-cooperation of the several paraboloid depressions thereof with the several solar cells 200. For purposes of clarity, the particular method of mounting solar cells 200 is not shown in Figure 3 but rather is illustrated in Figure 4.

At the outset, there needs to be examined the nature of the photovoltaic semiconductor device (or solar cell) 400. Solar cell 400 preferably comprises suitable semiconductor material such as silicon or germanium containing a selected activating substance in the lattice structure of the intrinsic material in order to provide the desired semiconductor characteristics. Atomic quantities of the activating substance may be distributed throughout the material in the proportion of the order of one atom of activating substance for every one hundred million atoms of the intrinsic material of the solar cell. Arsenic, antimony, or other suitable electron donor materials may thus be employed as an activating substance to constitute the cell 400 as intrinsically an N-type semiconductor. Correspondingly, boron, aluminum, indium, or other suitable electron acceptor materials may be employed as an activating substance if it is desired to constitute the cell 400 as intrinsically a P-type semiconductor. Let it be assumed that it is desired that the intrinsic composition of solar cell 400 be that of N-type semiconductor material. In such event, exposed surfaces 401 of solar cells 400 may be exposed for a given time to the penetrations of boron gas, for example. Such gas will diffuse through the exposed surface of solar cell 400 to constitute ultimately, beneath the surface 401 (or rather, above surface 401 as cell is shown in Figure 4), a typical P–N junction 402. Disc-shaped bonding layer 403 and ring-shaped bonding layer 404 may consist essentially of copper, nickel, silver, platinum, or other suitable bonding material; both are deposited by electrolysis or by other means upon the respective surfaces of solar cell 400. The solar cell 400 may be hot tin dipped to provide tin solder layers 405 and 406, fused with their respective bonding layers. Bonding ring layer 407 may be electroplated or otherwise affixed to base portion 408 partially defining angular depression 409, provided in thermoplastic transparent or translucent sheet 410, to provide for the mounting and fusing upon bonding ring 407 of solder layer 405 of solar cell 400. It is to be noted that thermoplastic sheet 410 is provided with conductive strips 411 and 412. These conductive strips may be composed of copper material and may be either electroplated upon plastic sheet 410 or may be formed by the photo etch process. Aperture 413 may be included in plastic sheet 410 to provide for the connection, both physically and electrically, of conductive strip 412 with bonding ring 407 by means of solder or other conductive means 414. Annular ring 415 has a T-shaped cross-section and is joined in low ohmic contact, by solder or other means, to conductive strip 411 and also to annular solder ring 406 of solar cell 400. An annular air space 416 may be provided as an insulating area for proceeding the shorting out of the P–N junction 402 by annular T-shaped ring 415. Disposed of course beneath the solar cell and mounting structure is paraboloidal reflective element 417 with axis 418 thereof passing through the center of solar cell 400.

The apparatus shown in Figure 4 operates as follows. Impingement of light rays upon reflector 417 causes concentrated reflection of the impinging light upon light sensitive area 401 of solar cell 400 so as to achieve hole-electron pair production throughout each of P–N junctions 402 of the solar cells. Accordingly, there will be developed a utilizable potential difference between conductors 411 and 412, disposed upon the thermal plastic sheet 410. Electron conduction is achieved by several bonding and solder layers, by annular conductive ring member 415, and by conductor 414. Annular air space 416 serves as a heat sink and may be connected to the outside atmosphere by means of either or both conduit apertures 419 and 420 indicated by dotted lines. The upper surfaces of upper bonding ring 407 and of solder layer 405 may serve to reflect incident light so as to prevent unnecessary heat generation by the solar cell apparatus.

Figure 4:
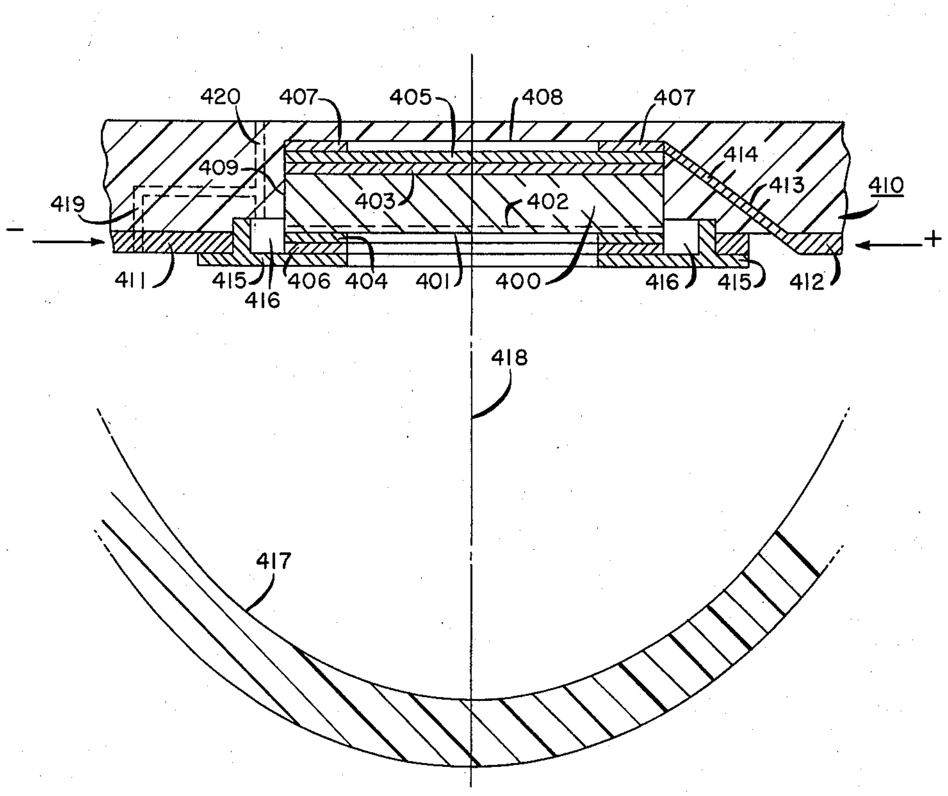
Figure 4 is an enlarged elevational view (shown in cross-section) of one section of apparatus utilized in the present invention.
Figure 5:
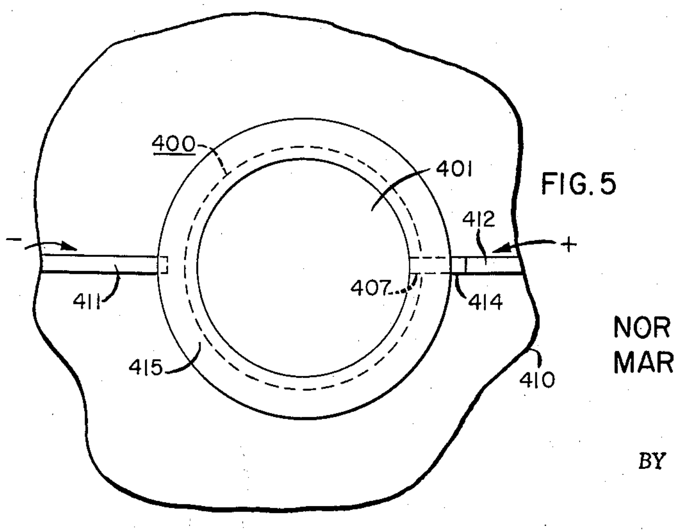
Figure 5 is a bottom view of the upper portion of the apparatus shown in Figure 4, reduced in size.

Figure 5 is a partial bottom view of the solar cell and mounting apparatus in Figure 4.

Figure 6:
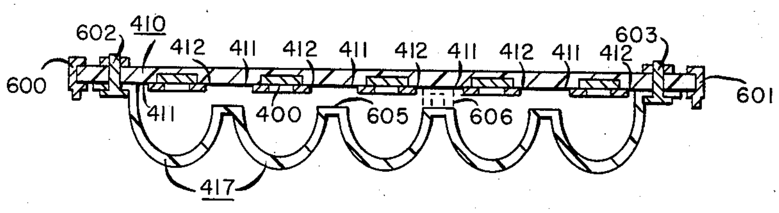
Figure 6 is an elevational view, in section, showing the light sensitive voltage producing device as contemplated by the present invention utilizing the basic apparatus shown in Figures 4 and 5 without the details thereof.

Figure 6 illustrates that plastic sheet 410 may accommodate the mounting therewith of several solar cells 400 together with the placement therebetween of conductive strips 411—412, whose extreme conductive strips are also connected to electrical terminals 600 and 601, mounted upon plastic sheet 410. Means 602 and 603 may be provided to accommodate the mounting of the reflector depression sheet 604 to the transparent plastic sheet 410. The juncture areas 605 of reflector sheet 604, between adjacent, paraboloid, reflector surfaces, may be physically separated from the transparent sheet 410, or may straddle conductive strip or strips as is indicated in the dotted line configuration of 606.

The operation of the apparatus shown in Figure 6 is as follows: Solar cells are shown to be connected electrically in series relationship. Thus, a relatively high voltage can be obtained from terminals 600 and 601. It is to be noted that the solar cell structure is completely enclosed and the whole may be hermetically sealed.

Figure 7:
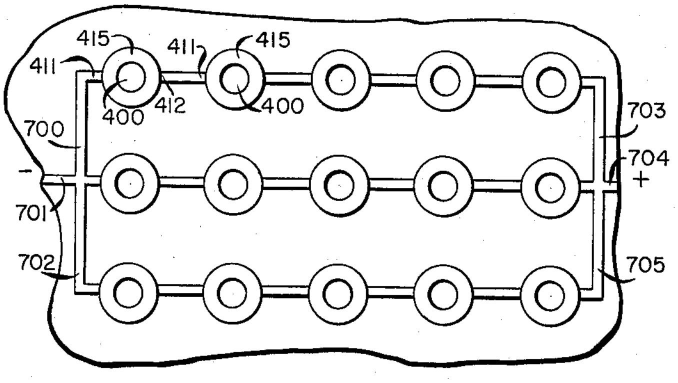
Figure 7 is a partial bottom view of the apparatus in Figure 6 with the reflector apparatus removed.

Figure 7 is a partial bottom view of the apparatus of Figure 6, illustrating that the solar cells may be connected in series-parallel relationship, if desired. In the event of choice of the solar cell interconnection embodiment of Figure 7, additional conductive strips 700 through 705 will have to be supplied. These may be formed, again, either by the photo etch process or by electroplating.

By the apparatus of Figures 6 and 7, an appreciable voltage source may be obtained with high current carrying capacity. It is to be noted, particularly with reference to Figure 6, that a large cross-section of the sun's rays is utilized with production of electrical energy, and this with the employment of a minimum number of solar cells. The light concentrative effects of the reflected sunlight upon the solar cell will cause such cells to produce a maximum number of hole-electron pairs in the vicinity of their P–N junctions for most of the daylight hours, be the day bright or overcast.

While particular embodiments of the present invention have been shown and described, it will be obvious to those skilled in the art that changes and modifications may be made without departing from this invention in its broader aspects, and, therefore, the aim in the appended claims is to cover all such changes and modifications as fall within the true spirit and scope of this invention.

We claim:

1. In combination, a reflector sheet having a plurality of cup-shaped indentations with central axes and inner reflective surfaces; a plurality of solar cells each having a light receiving surface disposed normal to one of said axes such that each of said axes pass through the center of a respective one of said light receiving surfaces; said light receiving surfaces of said solar cells facing said indentations in proximate relationship therewith for receiving light reflections therefrom over substantially the entire surface of each cell; a translucent sheet mounted to said reflector sheet; said translucent sheet also accommodating the mounting thereupon of said solar cells; and electrical connector means inter-coupling said solar cells.

2. Apparatus according to claim 1 in which said translucent sheet is provided with a plurality of depressions accommodating the mounting therewithin of respective ones of said solar cells, a light reflective conductive layer disposed upon the bottom of each of said depressions and bonded with the inner surface of a respective one of said solar cells, electrically conductive means connecting each of said conductive layers with a respective one of said conductive strips, a plurality of ring members each having a T-shaped cross-section mounting each of said solar cells within a respective one of said depressions and bonding the lower surfaces thereof with a respective remaining conductive strip.

3. Apparatus according to claim 2 in which an air space is provided between each of the annular central leg portions of said ring members and respective ones of each of said solar cells.

4. Apparatus according to claim 3 in which air conduit apertures are provided in said plastic sheet connecting each of said annular air spaces to a surface of said sheet.

5. In combination, a reflector sheet having a plurality of cup-shaped indentations having central axes of revolution and inner reflective surfaces; said inner reflective surfaces comprising sections of paraboloids of revolutions; a plurality of solar cells each having a light receiving surface disposed normal to one of said axes such that each of said axes pass through the center of a respective one of said light receiving surfaces; said light receiving surfaces of said solar cells facing said indentations in proximate relationship therewith for receiving light reflections therefrom over substantially the entire surface of each cell; a translucent sheet mounted to said reflector sheet; said translucent sheet also accommodating the mounting thereupon of said solar cells; and electrical connector means inter-coupling said solar cells.

References Cited in the file of this patent

UNITED STATES PATENTS

| | | |
|---|---|---|
| 588,177 | Reagen | Aug. 17, 1897 |
| 1,093,498 | Thring | Apr. 14, 1914 |
| 1,162,505 | Nichols | Nov. 30, 1915 |
| 1,345,586 | Coblentz | July 6, 1920 |
| 1,379,166 | Case | May 24, 1921 |
| 2,137,466 | Tonnies | Nov. 22, 1938 |
| 2,622,117 | Benzer | Dec. 16, 1952 |
| 2,728,809 | Falkenthal | Dec. 27, 1955 |
| 2,788,381 | Baldwin | Apr. 9, 1957 |